US012787739B2

(12) United States Patent
Kang et al.

(10) Patent No.: US 12,787,739 B2
(45) Date of Patent: Nov. 3, 2026

(54) SUPER VIA WITHIN BACKSIDE LEVEL

(71) Applicant: INTERNATIONAL BUSINESS MACHINES CORPORATION, Armonk, NY (US)

(72) Inventors: Tsung-Sheng Kang, Ballston Lake, NY (US); Tao Li, Slingerlands, NY (US); Ruilong Xie, Niskayuna, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 565 days.

(21) Appl. No.: 18/175,903

(22) Filed: Feb. 28, 2023

(65) Prior Publication Data

US 2024/0290688 A1 Aug. 29, 2024

(51) Int. Cl.

| | |
|---|---|
| ***H10W 20/20*** | (2026.01) |
| ***H10W 20/00*** | (2026.01) |
| ***H10W 20/41*** | (2026.01) |
| ***H10W 20/42*** | (2026.01) |

(52) U.S. Cl.

CPC ......... *H10W 20/20* (2026.01); *H10W 20/032* (2026.01); *H10W 20/42* (2026.01); *H10W 20/435* (2026.01)

(58) Field of Classification Search

CPC ........... H01L 23/5226; H01L 23/53238; H01L 23/481; H01L 23/5283; H01L 23/53295; H01L 21/76877; H01L 21/76843; H01L 21/76841; H01L 21/76849; H10W 20/42; H10W 20/425; H10W 20/435; H10W 20/20; H10W 20/076; H10W 20/43; H10W 20/077

See application file for complete search history.

(56) References Cited

U.S. PATENT DOCUMENTS

| | | | | |
|---|---|---|---|---|
| 8,093,099 | B2 * | 1/2012 | Purushothaman ..... | H10B 99/22 438/117 |
| 8,319,336 | B2 | 11/2012 | Chang | |
| 8,908,383 | B1 | 12/2014 | Railkar | |
| 9,330,974 | B2 * | 5/2016 | Kim .................... | H01L 23/5329 |
| 9,805,972 | B1 | 10/2017 | Zhang | |
| 10,020,254 | B1 | 7/2018 | Bao | |
| 10,020,255 | B1 | 7/2018 | Bao | |
| 10,026,687 | B1 | 7/2018 | Lin | |

(Continued)

*Primary Examiner* — John M Parker

(74) *Attorney, Agent, or Firm* — Seed Intellectual Property Law Group LLP

(57) ABSTRACT

A semiconductor IC device includes a super via. The super via includes a lower skip via and an upper skip via. A connecting wire may be directly between or may separate the lower skip via and the upper skip via. The upper skip via may be adequately electrically isolated from a surrounding wire by an upper liner. The lower skip via may be adequately electrically isolated from a surrounding wire by a lower liner. The super via along with the connecting wire may connect a wire in the lowest wiring level with a wire in the highest wiring level. Because of the lower liner and/or the upper liner, the super via may be utilized for wiring and routing through a backside level of the semiconductor IC device (e.g., potential or signal routing) and be utilized as a heat transfer conduit through the backside of the semiconductor IC device.

19 Claims, 13 Drawing Sheets

(56) References Cited

U.S. PATENT DOCUMENTS

| | | | | |
|---|---|---|---|---|
| 10,636,739 | B2 | 4/2020 | Beyne | |
| 11,302,630 | B2 * | 4/2022 | Standaert | H01L 21/3212 |
| 11,355,410 | B2 | 6/2022 | Huang | |
| 12,046,537 | B2 * | 7/2024 | Wang | H01L 23/564 |
| 12,272,648 | B2 * | 4/2025 | Xie | H10D 84/0186 |
| 2002/0149110 | A1 * | 10/2002 | Ahn | H01L 23/485 257/758 |
| 2003/0146515 | A1 * | 8/2003 | Kajiyama | G11C 11/1659 257/E27.005 |
| 2009/0115026 | A1 | 5/2009 | Gerber | |
| 2009/0160020 | A1 * | 6/2009 | Barth | H01L 23/5223 257/532 |
| 2011/0101349 | A1 * | 5/2011 | Oda | H01L 22/32 257/E23.08 |
| 2011/0175226 | A1 * | 7/2011 | Bonilla | H01L 21/76816 257/E21.585 |
| 2011/0266691 | A1 * | 11/2011 | Lin | H01L 23/5226 257/E27.111 |
| 2012/0025386 | A1 * | 2/2012 | Murata | H10B 63/84 257/E29.139 |
| 2012/0319278 | A1 * | 12/2012 | Lin | H01L 21/76885 257/E21.584 |
| 2013/0271938 | A1 * | 10/2013 | Lindert | H10D 1/716 361/782 |
| 2020/0295134 | A1 * | 9/2020 | Do | H01L 23/5226 |
| 2021/0028112 | A1 * | 1/2021 | Kim | H10D 84/0158 |
| 2022/0262738 | A1 * | 8/2022 | Lee | H01L 23/53266 |
| 2022/0384311 | A1 * | 12/2022 | Oh | H10D 84/038 |
| 2023/0132353 | A1 * | 4/2023 | Xie | H01L 23/535 257/288 |
| 2023/0215801 | A1 * | 7/2023 | Hsu | H01L 21/7684 |
| 2023/0230901 | A1 * | 7/2023 | Farooq | H01L 23/481 257/774 |
| 2023/0253327 | A1 * | 8/2023 | Lee | H01L 21/76843 257/774 |
| 2023/0317596 | A1 * | 10/2023 | Kim | H10D 84/834 257/401 |
| 2023/0343839 | A1 * | 10/2023 | Kim | H01L 23/481 |
| 2023/0377968 | A1 * | 11/2023 | Chuang | H01L 24/08 |
| 2024/0379623 | A1 * | 11/2024 | Chen | H01L 24/83 |

* cited by examiner

SUPER VIA WITHIN BACKSIDE LEVEL

BACKGROUND

The present application relates to semiconductors, and more specifically, to techniques for forming integrated circuit (IC) semiconductor devices. Semiconductor IC devices, such as wafers, dies, processors, IC chips, or the like, have become ubiquitous within many products, particularly as they continue to decrease in cost and size. There is a continued desire to reduce the size of structural features and/or to provide a greater amount of structural features for a given die size. Miniaturization, in general, allows for increased performance at lower power levels and lower cost. Present technology is at or approaching atomic level scaling of certain micro-devices such as logic gates, field-effect transistors (FETs), and capacitors. As the electricity required to a relatively increased number of micro-devices within integrated circuit die has increased, so too has the need to remove heat, the byproduct of the electricity, from integrated circuit die.

One technique to reduce the size of integrated circuits is to use a backside power distribution network (BSPDN), in which through substrate vias (TSVs) are used to supply power through a backside of the semiconductor IC device to microdevices upon or within a more central substrate of the semiconductor IC device and/or to signal routing pathways within a frontside of the semiconductor IC device.

SUMMARY

Embodiments of the disclosure provide techniques for forming a semiconductor integrated circuit device.

In an embodiment, a semiconductor integrated circuit device is presented. The semiconductor integrated circuit device includes a front-end-of-line (FEOL) level, a frontside back-end-of-line (BEOL) level upon a frontside of the FEOL level, and a backside BEOL level upon a backside of the FEOL level. The backside BEOL level includes a super via. The super via includes a lower skip via, an upper skip via, a lower liner around sidewall(s) of the lower skip via, and an upper liner around sidewall(s) of the upper skip via. The backside BEOL level further includes a M3 level wire between the lower skip via and the upper skip via.

In another embodiment of the disclosure, a packaged semiconductor integrated circuit device is presented. The packaged semiconductor integrated circuit device includes a carrier, a cover connected to the carrier, and a semiconductor integrated circuit device electrically connected to the carrier by a plurality of interconnects and conduction connected to the cover. The semiconductor integrated circuit device includes a front-end-of-line (FEOL) level, a frontside back-end-of-line (BEOL) level upon a frontside of the FEOL level, and a backside BEOL level upon a backside of the FEOL level. The backside BEOL level includes a super via. The super via includes a lower skip via, an upper skip via, a lower liner around sidewall(s) of the lower skip via, and an upper liner around sidewall(s) of the upper skip via. The backside BEOL level further includes a M3 level wire between the lower skip via and the upper skip via.

In another embodiment of the present disclosure, a method to fabricate a semiconductor IC device is presented. The method includes forming a lower skip via opening through a V3 level passivation layer portion, through a M2 level wire, and through a V2 level passivation layer portion. The lower skip via opening exposes a portion of a top surface of a M1 level wire. The method further includes forming a lower liner upon inner sidewalls of the lower skip via opening, forming a lower skip via upon the lower liner and upon the exposed portion of the top surface of the M1 level wire, and forming a M3 level wire upon the lower skip via. The method further includes forming an upper skip via opening through a V5 level passivation layer portion, through a M4 level wire, and through a V4 level passivation layer portion. The upper skip via opening exposes a portion of a top surface of the M3 level wire. The method further includes forming an upper liner upon inner sidewalls of the upper skip via opening and forming an upper skip via upon the upper liner and upon the exposed portion of the top surface of the M3 level wire.

These and other features and advantages of embodiments described herein will become more apparent from the accompanying drawings and the following detailed description.

DETAILED DESCRIPTION

Figure 1:
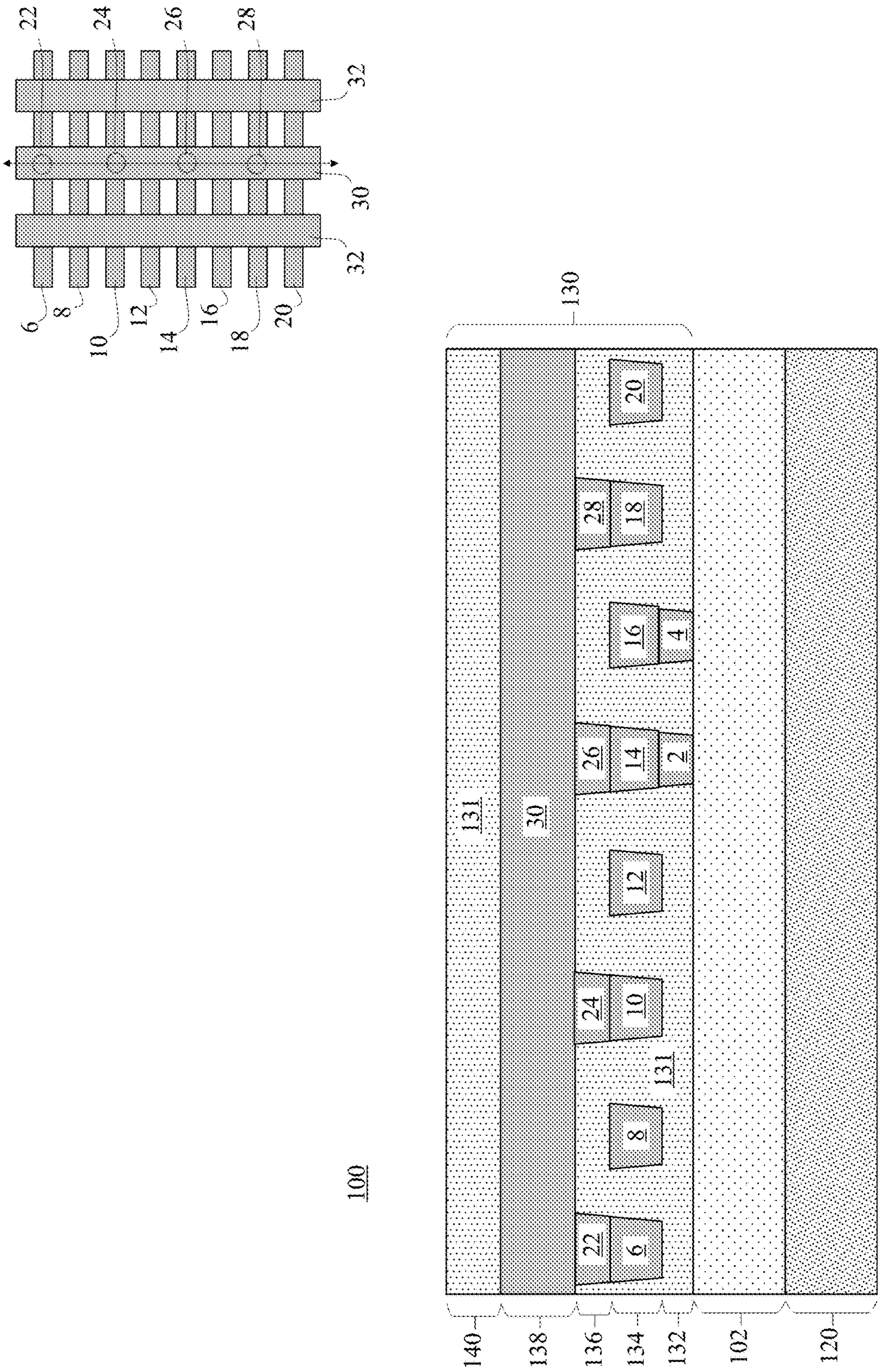
FIG. 1 through FIG. 9 depict respective top-down views and cross-section views of a semiconductor IC device that is to include a super via within a backside level, according to one or more embodiments of the disclosure.

Illustrative embodiments of the disclosure may be described herein in the context of illustrative methods for forming integrated circuit dies with thermally conducting perimeter solder, along with illustrative apparatus, systems and devices formed using such methods. However, it is to be understood that embodiments of the disclosure are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

With continuous scaling, more and more microdevices (e.g., transistors) are packed into IC semiconductor devices (e.g., into one or more 100-millimeter $(mm)^2$ dies). To provide desired functionality, microdevices must be interconnected through wiring and routing which supply power and/or provide signal pathways. With an increased number of devices in an integrated circuit, more and more wiring and routing resources are required to precisely connect the IC semiconductor device as desired for a particular use case. Thus, for example, more and more metal layers may be needed to connect all of the microdevices in an IC semiconductor device.

IC semiconductor devices may be fabricated as a part of a wafer which may undergo front-end-of-line (FEOL) processing for fabricating microdevices (e.g., transistors, capacitors, resistors, diodes, memory cells, etc.) on the wafer and back-end-of-line (BEOL) processing for interconnecting the microdevices. More particularly, BEOL processes are typically focused on forming metal interconnects between the different microdevices of an IC semiconductor device, whereas the fabrication of the different microdevices that make up the IC semiconductor device is typically done during FEOL processing.

In FEOL processing, microdevices, such as complementary metal-oxide-semiconductor (CMOS) field-effect transistors (FET) devices, nanostructure (FETs), or the like, are formed by a series of steps. For example, masking layers (e.g., photolithographic masks) may be used to form patterns on the wafer. Such masking layers may be used to control or define specific regions where material is to be etched or removed, as well as to control or define specific regions where material is to be formed (e.g., through deposition, growth, etc.). In some cases, materials may be blanket deposited, followed by patterning of one or more masking layers to remove previously deposited materials in some areas while leaving the previously deposited material in other areas.

In BEOL processing, fabrication of the IC semiconductor device continues by forming interconnects through one or more layers of wiring and dielectric passivation layers over the microdevices in the FEOL level. Interconnections or interconnects may include metallic structures that are formed in multiple levels of the dielectric passivation layers for electrically connecting the various microdevices in the FEOL level. Following FEOL and BEOL processing, the wafer may be separated or divided into multiple integrated circuit (IC) dies by dicing or other suitable techniques. In some cases, BEOL levels may be formed on both sides (e.g., "front" and "back" sides) of the FEOL level, improving wiring and routing resources.

The IC semiconductor device may include the FEOL level with a first BEOL level on a frontside of the FEOL level and a second BEOL level on a backside of FEOL level.

The first BEOL level may include metal or otherwise conductive lines for signal routing from the front side of the FEOL level. The second BEOL level may include metal or otherwise conductive lines for power delivery from the back side of the FEOL level thereby providing a back side power delivery network (BSPDN) to the FEOL level of the semiconductor IC device.

Various structures described herein may be implemented various semiconductor IC devices. A semiconductor IC device can be distributed by the fabricator in raw wafer form (that is, as a single wafer that has multiple unpackaged IC dies), as a bare IC die, or in a packaged form. In the latter case, an IC die is mounted in a single or multiple IC die package. The single or multiple IC die package may include the die(s), a carrier, a cover, a heatsink, and/or the like. The carrier may include leads that may be affixed to the ICs on one side and leads that may be affixed to a motherboard or other higher level carrier on the other side. In any case, the IC dies(s) may then be integrated with other dies, discrete circuit elements, and/or other signal processing devices as part of either: (a) an intermediate product, such as a motherboard, or (b) an end product. The end product can be any product that includes the semiconductor IC device, ranging from toys and other low-end applications to advanced computer products having a display, a keyboard or other input device, and a central processor.

In some embodiments of the disclosure, a semiconductor IC device fabrication method includes fabricating microdevices within a FEOL level, with fabricating a first (e.g., "frontside") BEOL level, and a second (e.g., backside BEOL) level. The FEOL level with active devices is formed over the first BEOL level, followed by a second BEOL level over the FEOL region. The semiconductor IC device fabrication method may include flipping the structure and fabricating the second BEOL level from the backside of the FEOL level.

The semiconductor IC device fabrication method may include forming a super via within the second BEOL level. In semiconductor IC device technology, a super via, also known as a skip via, can be formed through different wiring levels whereby at least one or more wiring levels are bypassed so as to connect with a lower wiring structure. The super via may be a part of or included in a metal pillar that extends through the entire thickness of the second BEOL level. The metal pillar may be connected electrically, mechanically, directly, and/or indirectly to a microdevice. The metal pillar may further include a lead or connection pad on the backside of the semiconductor IC device that may enable the semiconductor IC device to connect with the carrier (e.g., a solder ball, fuzzy button, etc. may connect the lead of the semiconductor IC device to the lead of the carrier). The super via may provide for more efficient wiring and routing through the second BEOL level, may provide improved resistance characteristics through the second BEOL level, may reduce capacitance within the second BEOL level, may provide for wiring and routing area efficiencies through the second BEOL level.

The super via may be formed through the second BEOL level for local heat removal from the backside of the semiconductor IC device (i.e., toward and through an underlying carrier). The heated removed from through the second BEOL level from the backside of the semiconductor IC device by the super via may be a concentrated heat removal, such that a greater amount of heat is removed from the backside of the semiconductor IC device by the super via relative to the amount of heat removed from the backside of the semiconductor IC device by the passivation layer portions that surround the super via.

Additionally, a separate super via may be formed through the first BEOL level for local heat removal from the frontside of the semiconductor IC device (i.e., toward and through an above cover). Thermal modeling demonstrates that super vias within the semiconductor IC device can reduce the maximum semiconductor IC device temperature by more than one degree Celsius. The super via described herein thus provides significant value for various semiconductor IC devices, where even a single degree temperature change is considered impactful.

Thus, the super via described herein advantageously places a power conductive line or path that may be used to provide power (e.g., VSS, VDD, etc.) to the semiconductor IC device (e.g., to one or more microdevices) through the second BEOL level, places a signal conductive path that may be used to provide signals (e.g., input, logic, etc.) to the semiconductor IC device (e.g., to one or more microdevices)

through the second BEOL level, and/or places a thermal conducting pathway through the second BEOL level of the semiconductor IC device.

The flowcharts and cross-sectional diagrams in the drawings illustrate methods of fabricating semiconductor IC devices that include a super via within a backside level (such as a BSPDN), according to various embodiments of the disclosure. In some alternative implementations, the fabrication steps may occur in a different order that that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer “A” over layer “B” include situations in which one or more intermediate layers (e.g., layer “C”) is between layer “A” and layer “B” as long as the relevant characteristics and functionalities of layer “A” and layer “B” are not substantially changed by the intermediate layer(s).

The following definitions and abbreviations are to be used for the interpretation of the claims and the specification. As used herein, the terms “comprises,” “comprising,” “includes,” “including,” “has,” “having,” “contains” or “containing,” or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms “upper,” “lower,” “right,” “left,” “vertical,” “horizontal,” “top,” “bottom,” and derivatives thereof shall relate to the described structures and methods, as oriented in the drawing figures. The terms “overlying,” “atop,” “on top,” “positioned on” or “positioned atop” mean that a first element, such as a first structure, is present on a second element, such as a second structure, wherein intervening elements such as an interface structure can be present between the first element and the second element. The term “direct contact” means that a first element, such as a first structure, and a second element, such as a second structure, are connected without any intermediary conducting, insulating or semiconductor layers at the interface of the two elements. It should be noted, the term “selective to,” such as, for example, “a first element selective to a second element,” means that a first element can be etched, and the second element can act as an etch stop.

For the sake of brevity, conventional techniques related to semiconductor device and/or IC fabrication may or may not be described in detail herein. Moreover, the various tasks and process steps described herein can be incorporated into a more comprehensive procedure or process having additional steps or functionality not described in detail herein. Various steps in the manufacture of semiconductor IC devices are well known and so, in the interest of brevity, many conventional steps will only be mentioned briefly herein or will be omitted entirely without providing the well-known process details.

In general, the various processes used to form a semiconductor IC device, such as a micro-chip, that will be packaged into an IC, fall into four general categories, namely, material deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Materials of both conductors (e.g., poly-silicon, aluminum, copper, etc.) and insulators (e.g., various forms of silicon dioxide, silicon nitride, etc.) are used to connect and isolate other wiring or device components. Semiconductor lithography is the formation of three-dimensional relief images or patterns in the underlying material(s) for subsequent transfer of the pattern to the material(s). In semiconductor lithography, the patterns are formed by a light sensitive polymer called a photoresist.

Figure 10:
FIG. 10 and FIG. 11 depicts respective top-down views and cross-section views of a semiconductor IC device includes a super via within a backside level, according to one or more embodiments of the disclosure.

Referring now to the drawings in which like numerals represent the same or similar elements and initially to FIG. 1 which depicts a cross-section view of a semiconductor IC device 100 that is to include a super via 190, exemplarily depicted in FIG. 10, according to one or more embodiments of the disclosure. The semiconductor IC device 100 includes a FEOL level 102, a frontside BEOL level 120, which may also be referred herein as a frontside level 120, and a second BEOL level 130, which may also be referred herein as backside level 130.

The FEOL level 102 may include a semiconductor substrate and a plurality of microdevices formed upon or therefrom. For example, several transistors may be formed over the substrate. Each transistor may have a source, drain, and gate. The transistors may be a FinFET, Gate all around FET, Forksheet FET, or the like.

The frontside BEOL level 120 connects to the of FEOL level 102 across a frontside interface. The frontside BEOL level 120 includes various wiring levels. The wiring levels may alternate between a via level and a metal level. To form a via level, an associated dielectric passivation layer may be formed, the dielectric passivation layer may be patterned to create a via opening therein, and conductive or metal material may be deposited within the via opening. To form a metal level, an associated dielectric passivation layer may be formed, the dielectric passivation layer may be patterned to create a wiring trench therein, and conductive or metal material may be deposited within the wiring trench. A via within a lowest frontside BEOL level 120 via level may connect either directly or indirectly to a microdevice. For example, a via within the lowest frontside BEOL level 120 via level may connect either directly or indirectly to one or more microdevice(s). The vias and wiring within the frontside BEOL level 120 effectively form respective conductive pathways that may be used to provide and/or to route respective signals (e.g., input, output, high, low, logic, etc.) to the microdevice(s) within the FEOL level 102. The term signal is defined herein to be a time-dependent value related to or affected by a physical phenomenon that is transmitted by the respective conductive pathway(s) and is used to convey data.

The backside level 130 connects to the of FEOL level 102 across a backside interface. The backside level 130 includes various wiring levels. The wiring levels may alternate between a via level and a metal level. Vias within the via levels and the conductive wires in the metal levels may be arranged to form numerous conductive pathways away from the backside interface. Vias within the via levels and conductive wires in the metal levels may be separated by passivation layer 131. Passivation layer 131 may include one or more passivation layers consisting of inorganic (e.g., nitride, oxide, etc.) and/or organic (e.g., polyimide, etc.) layers. For example, passivation layer 131 may be formed of dielectric materials such as silicon oxide (SiO), hydrogenated silicon carbon oxide (SiCOH), SiCH, SiCNH, or other types of silicon based low-k dielectrics (e.g., k less than about 4.0), porous dielectrics, or ULK (ultra-low-k) dielectric materials (with k less than about 2.5). Typically, passivation layer 131 is a relatively poor thermal conductor relative to metal.

Initially, the backside level 130 may be formed by depositing a passivation layer 131 portion upon the backside interface of FEOL level 102 within a V1 level 132. The V1 level 132 passivation layer 131 portion may be patterned to create one or more via opening(s) therein and conductive or metal may be deposited within the via opening(s) thereby forming via 2 and via 4. Via 2 and/or via 4 may connect either directly or indirectly to a microdevice within FEOL level 102. For example, via 2 or via 4 within the lowest V1 level 132 may connect either directly or indirectly to one or more microdevice.

The backside level 130 may be further fabricated by depositing passivation layer 131 portion upon the V1 level 132 within a M1 level 134. The M1 level 134 passivation layer 131 portions may be patterned to create one or more wiring trench(es) therein and conductive or metal may be deposited within the wiring trench(es) thereby forming VDD wires 6, 10, 14, and 18 and thereby forming VSS wires 8, 12, 16, and 20. VDD wire 14 may be located directly upon and/or vertically in line with via 2. VSS wire 16 may be located directly upon and/or vertically in line with via 4. As such, VDD wire 14 and VSS wire 16 may be connected to one or more microdevices within FEOL level 102.

The backside level 130 may be further fabricated by depositing passivation layer 131 portion upon the M1 level 134 within a V2 level 136. The V2 level 136 passivation layer 131 portion may be patterned to create one or more via opening(s) therein and conductive material (such as metal) may be deposited within the via opening(s) thereby forming via 22, via 24, via 26, and via 28. Via 22 may be formed directly upon VDD wire 6, via 24 may be formed directly upon VDD wire 10, via 26 may be formed directly upon VDD wire 14, and via 28 may be formed directly upon VDD wire 18.

The backside level 130 may be further fabricated by depositing passivation layer 131 portion upon the V2 level 136 within a M2 level 138. The M2 level 138 passivation layer 131 portions may be patterned to create one or more wiring trench(es) therein and conductive or metal may be deposited within the wiring trench(es) thereby forming VDD wire(s) 30 and thereby forming VSS wire(s) 32. VDD wire 30 may be located directly upon and/or vertically in line with via 22, via 24, via 26, and via 28. VSS wire 32 may be located directly upon and/or vertically in line with vias (not shown) in a different plane. As such, VDD wire 30 may be connected to one or VDD wires 6, 10, 14, and 18 within M1 level 134 by way of via 22, via 24, via 26, and via 28, respectively. Similarly, VSS wire 32 may be connected to one or VSS wires 8, 12, 16, and 20 within M1 level 134 by way of the vias (not shown) in the different plane, respectively.

The backside level 130 may be further fabricated by depositing passivation layer 131 portion upon the M2 level 138 within a V3 level 140.

Figure 2:
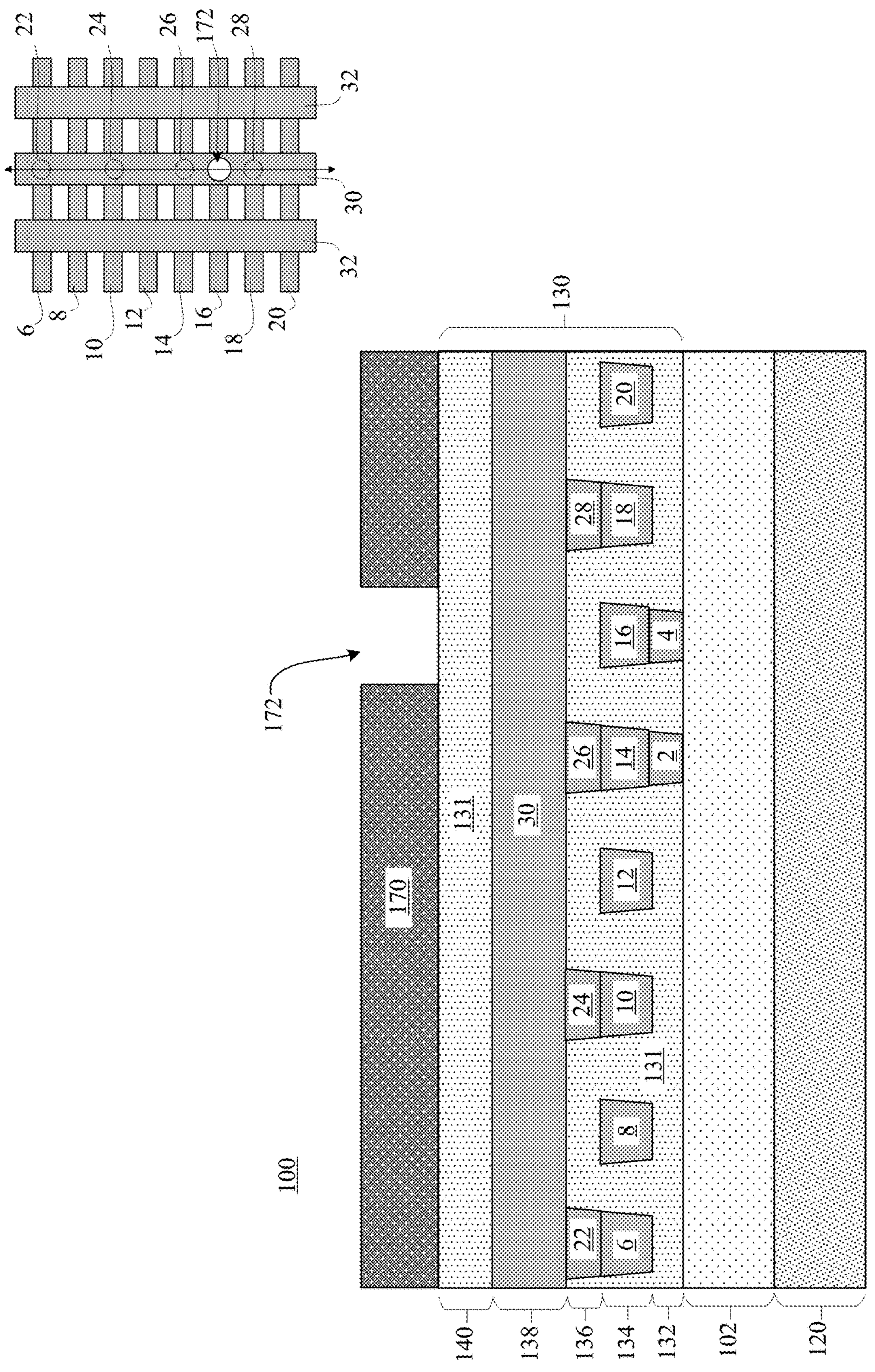

FIG. 2 depicts a top-down view and cross-section view of semiconductor IC device 100 that is to include super via 190 within backside level 130, according to one or more embodiments of the disclosure. At the present stage of fabrication, a mask 170 layer is formed upon the passivation layer 131 portion within the V3 level 140 and patterned.

Mask 170 may be formed upon the passivation layer 131 portion within the V3 level 140. For example, mask 170 may be formed as a blanket layer upon the underlying passivation layer 131 portion within the V3 level 140. The mask 170 may be formed by deposition of mask material(s) or layer(s) of mask material(s). In a particular embodiment, mask 170 may be a hard mask. Exemplary mask materials may be silicon nitride (SiN), a combination of SiN and Silicon Dioxide (SiO2), an organic planarization layer (OPL), or the like.

The mask 170 may be patterned by removing undesired portions of mask 170 while retaining desired portions of mask 170. The retained portions of patterned mask 170 may effectively protect underlying regions of the passivation layer 131 portion within the V3 level 140 while the removed portions of mask 170 form opening 172. The opening 172 may expose underlying regions of the passivation layer 131 portion within the V3 level 140 that correspond to a desired location of the super via 190 (e.g., vertically in line with via 4, VSS wire 16, etc.). The mask 170 may be patterned by lithography, etching, or other removal techniques.

Figure 3:
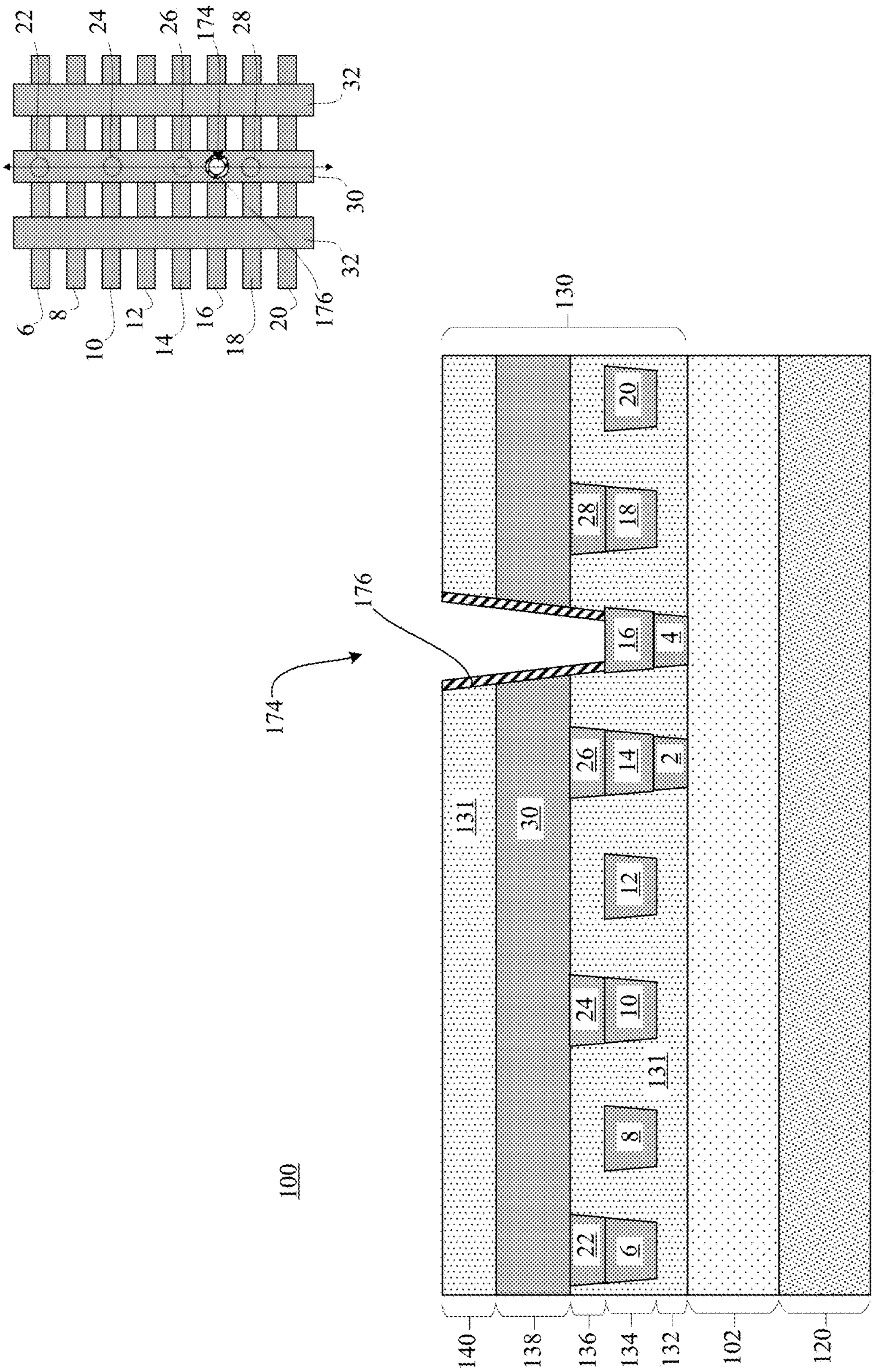

FIG. 3 depicts a top-down view and cross-section view of semiconductor IC device 100 that is to include super via 190 within backside level 130, according to one or more embodiments of the disclosure. At the present stage of fabrication, a lower skip via opening 174 is formed through the passivation layer 131 portion within the V3 level 140, through the VDD wire 30 within the M2 level 138, and through the passivation layer 131 portion within the V2 level 136. Subsequently, a liner 176 is formed within the lower skip via opening 174.

Using the patterned mask 170, the passivation layer 131 portion within the V3 level 140 exposed by opening 174 may be removed, the VDD wire 30 within the M2 level 138 exposed by opening 174 may be removed, and the passivation layer 131 portion within the V2 level 136 exposed by opening 174 may be removed.

Such portions of semiconductor IC device 100 may be removed by an etching process, such as a dry or wet etch. The dry and wet etching processes can have etching parameters that can be tuned, such as etchants used, etching temperature, etching solution concentration, etching pressure, source power, RF bias voltage, RF bias power, etchant flow rate, and other suitable parameters to achieve the desired material removal. For example, a first etchant may be used to remove the exposed passivation layer 131 stopping on VDD wire 30, a next etchant may be used to remove the exposed portion of VDD wire 30 stopping on the passivation layer 131 portion within the V2 level 136, then a next etchant may be used to remove the exposed passivation layer 131 portion within the V2 level 136 stopping on VSS wire 16. In another example, one etchant may be utilized and the semiconductor IC device 100 exposure to such etchant may be timed to remove the aforementioned exposed portions and stop material removal on VSS wire 16. Upon removal of the aforementioned exposed portions of the V3 level 140, the M2 level 138, and the V2 level 136, lower skip via opening 174 is formed.

Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

After formation of the lower skip via opening 174, liner 176 is formed upon the sidewall(s) thereof. Liner 176 may be formed by deposition techniques such PVD, CVD, ALD, or the like. The liner 176 can have a thickness of from about 2 nm to about 8 nm, although other thicknesses are within the contemplated scope. The liner 176 may be formed as a blanket layer. Horizontal portions of the liner 176 blanket layer may be removed along with mask 170 by a planarization process, such as a chemical mechanical polish (CMP), or the like. A retained portion the liner 176 blanket layer forms the liner 176 that generally lines the sidewall(s) of the lower skip via opening 174. Alternatively, the mask 170 may be removed (e.g., by an OPL ash, or the like) and the liner 176 may be subsequently formed upon the sidewall(s) the lower skip via opening 174.

As depicted, the liner 176 may be formed upon the upper surface of the VSS wire 16. The liner 176 may also be formed upon respective inner or internal sidewall surfaces of the passivation layer 131 portion within the V2 level 136, the VDD wire 30 within the M2 level 138, and the passivation layer 131 portion within the V3 level 140 that are associated with lower skip via opening 174. As depicted, the top surface(s) of liner 176 may be coplanar with the top surface of the passivation layer 131 portion within the V3 level 140.

Figure 4:
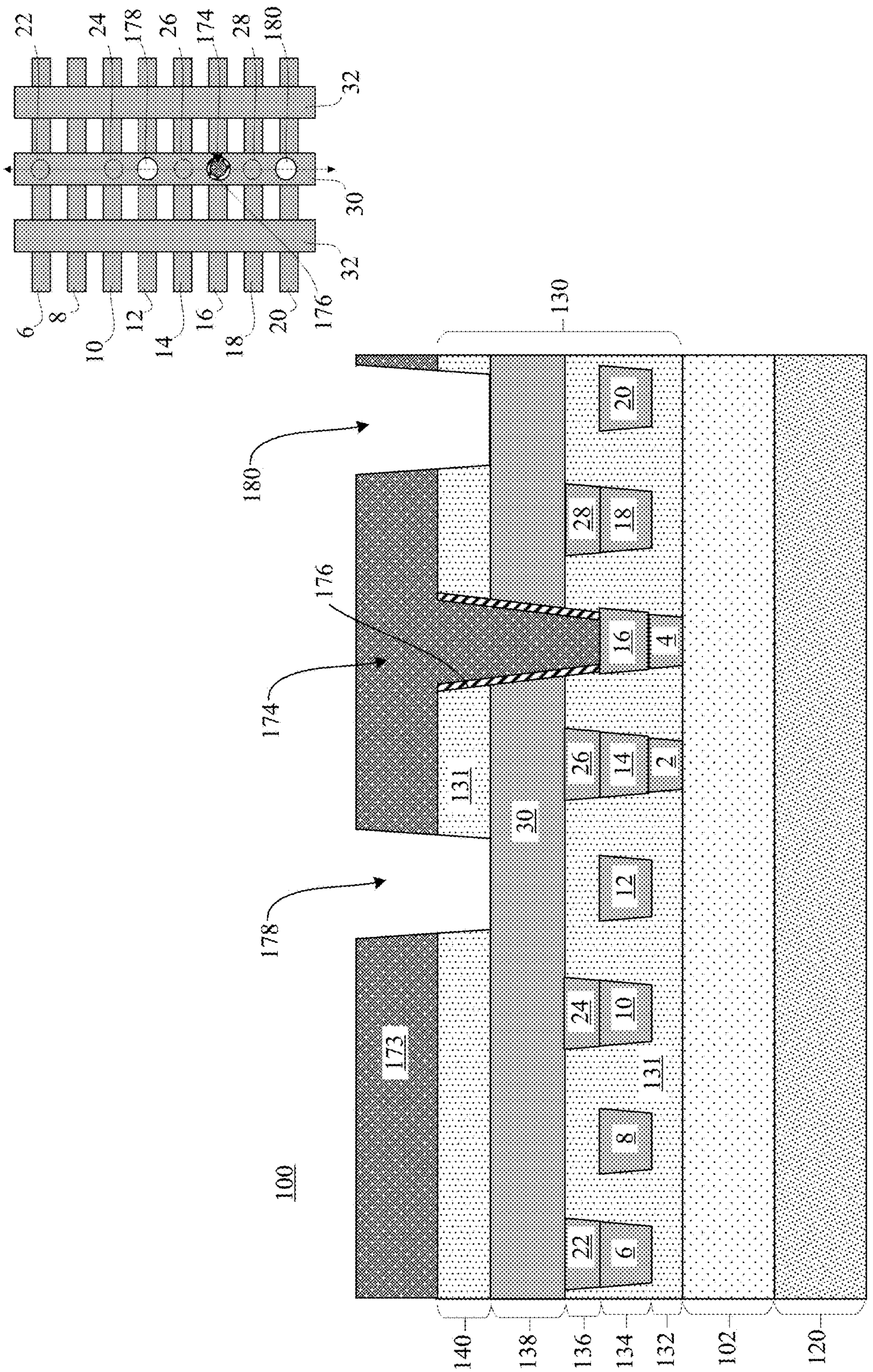

FIG. 4 depicts a top-down view and cross-section view of semiconductor IC device 100 that is to include super via 190 within backside level 130, according to one or more embodiments of the disclosure. At the present stage of fabrication, a mask 173 layer is formed upon the passivation layer 131 portion within the V3 level 140 and upon the liner 176 within lower skip via opening 174 and patterned.

Mask 173 may be formed upon the passivation layer 131 portion within the V3 level and upon the liner 176 thereby filling the lower skip via opening 174. For example, mask 173 may be formed as a blanket layer upon the underlying passivation layer 131 portion within the V3 level. The mask 173 blanket layer may be formed to a thickness to fill the lower skip via opening 174. The mask 173 may be formed by deposition of mask material(s) or layer(s) of mask material(s). In a particular embodiment, mask 173 may be a hard mask. Exemplary mask 173 materials may be SiN, a combination of SiN and SiO2, OPL, or the like.

The mask 173 may be patterned by removing undesired portions of mask 173 while retaining desired portions of mask 173. The retained portions of patterned mask 173 may effectively protect underlying regions of the passivation layer 131 portion within the V3 level 140 and protect the lower skip via opening 174 while the removed portions of mask 173 form via opening 178 and via opening 180 that may respectively expose underlying regions of the VDD wire 30 within the M2 level 138. For clarity, in a different plane, the mask 173 may also be patterned to form via openings that respectively expose underlying regions of the VSS wire 32 within the M2 level 138. The mask 170 may be patterned by lithography, etching, or other removal techniques.

Using the patterned mask 173, the passivation layer 131 portion within the V3 level 140 exposed by the via openings may be removed by an etching process, such as a dry or wet etch. The dry and wet etching processes can have etching parameters that can be tuned to achieve the desired material removal. For example, a first etchant may be used to remove the exposed passivation layer 131 stopping on VDD wire 30, VSS wire 32, respectively. Upon removal of the exposed portions of the V3 level 140 the applicable via openings (e.g., via opening 178, via opening 180, etc.) are formed. Subsequently, the mask 173 may be removed by removal techniques such as etching, ashing, or the like. Specifically, the mask 173 material upon the liner 176 within lower skip via opening 174 is removed and effectively reforms the lower skip via opening 174. As depicted, etch parameters may be chosen to result in a tapered opening profile where a diameter or dimension of the lower skip via opening 174 is larger at the top of the lower skip via opening 174 than a diameter or dimension of the lower skip via opening 174 at the bottom of the lower skip via opening 174.

Figure 5:
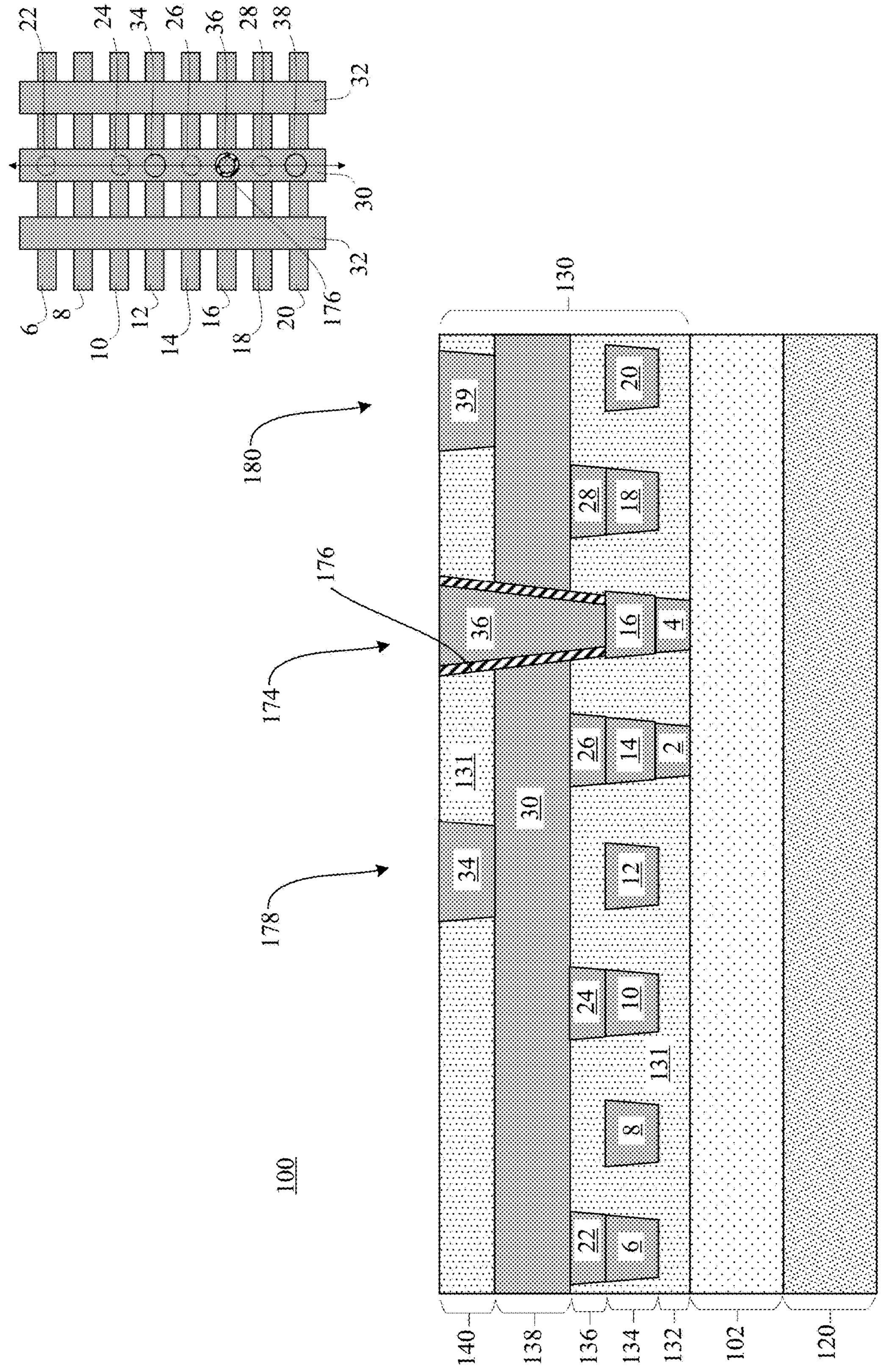

FIG. 5 depicts a top-down view and cross-section view of semiconductor IC device 100 that is to include super via 190 within backside level 130, according to one or more embodiments of the disclosure. At the present stage of fabrication, via 34 is formed within via opening 178, via 39 is formed within via opening 180, and lower skip via 36 is formed within lower skip via opening 174.

The via 34, via 39, and lower skip via 36 may be formed by depositing a conductive material, such as a metal, upon the passivation layer 131 portion within the V3 level, within the respective via openings that are located over e.g., VDD wire 30, VSS wire 32, or the like, and upon liner 176 within lower skip via opening 174. The via 34 and the via 39 may be formed directly upon VDD wire 30. Other vias in a different plane may be formed directly upon VSS wire 32. The lower skip via 36 may be formed directly upon VSS wire 16. The liner 176, therefore, may adequately electrically isolate the VDD wire 30 from the VSS lower skip via 36.

The via 34, via 39, and lower skip via 36 can be comprised of metals, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, excess conductive material can be removed by chemical-mechanical polishing (CMP), etching, grinding, polishing. Resultingly, the top surface of the passivation layer 131 portion within the V3 level 140, the top surface of via 34, the top surface of the via 39, the top surface of the liner 176, and/or the top surface of lower skip via 36 may be coplanar.

The tapered profile of super via opening 174 may enable or result in a diameter or dimension at the top of the lower skip via 36 being larger than a diameter or dimension at the bottom of the lower skip via 34. The diameter or dimension of the lower skip via 34 at the bottom of the lower skip via

36 may be smaller than (or inset from) the top width dimension of VSS wire 16, as depicted.

Figure 6:
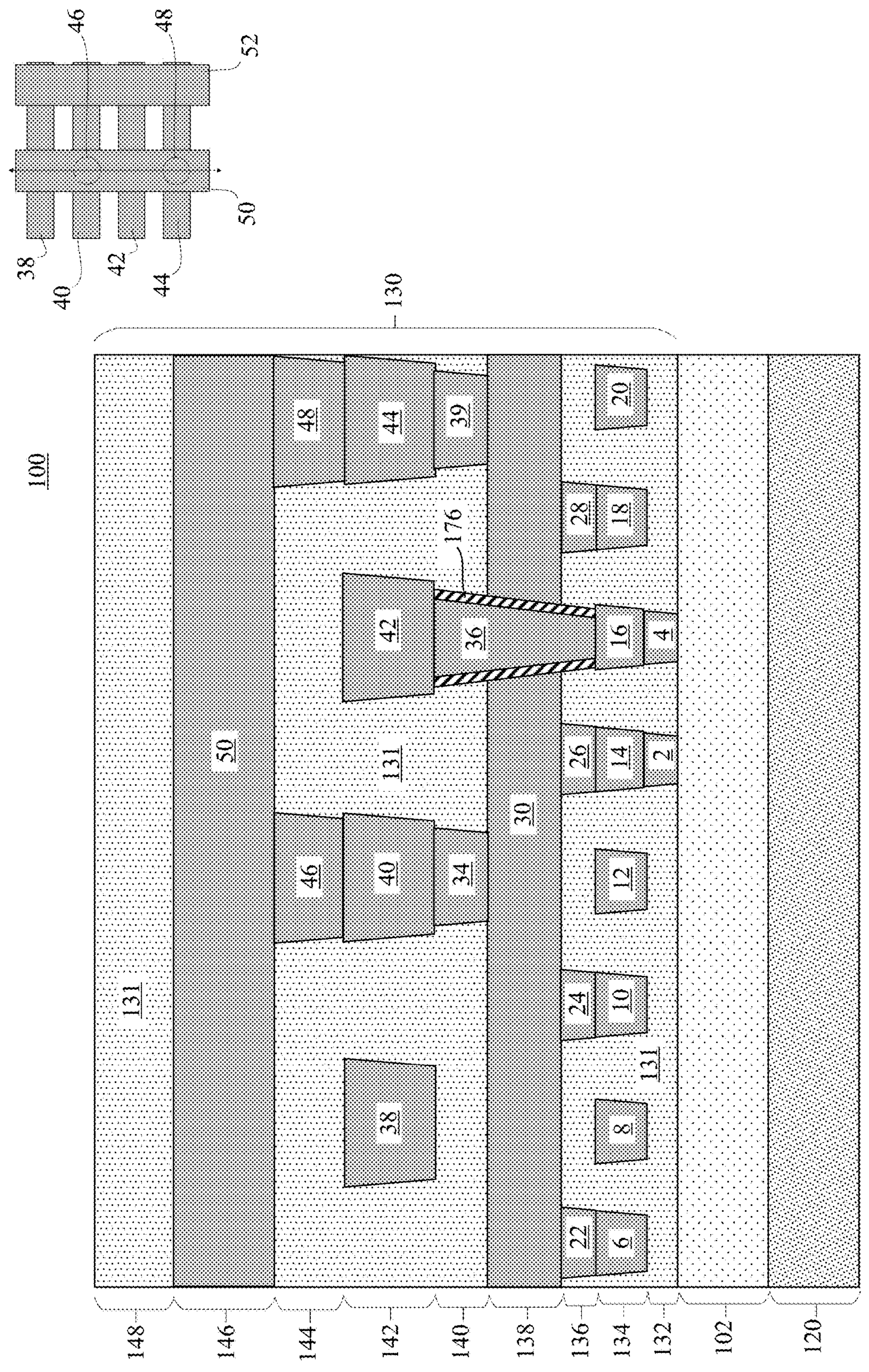

FIG. 6 depicts a top-down view and cross-section view of semiconductor IC device 100 that is to include super via 190 within backside level 130, according to one or more embodiments of the disclosure. At the present stage of fabrication, the backside level 130 may be further fabricated by forming M3 level 142, by forming V4 level 144, by forming M4 level 146, and by forming passivation layer 131 portion within V5 level 148.

The backside level 130 may be further fabricated by forming M3 level 142, which may also be referred herein as the mid-level of backside level 130 as there is an equal number of M levels above and below the M3 level 142. M3 level 142 may be formed by depositing a M3 level 142 passivation layer 131 portion upon the V3 level 140. For example, the M3 level 142 passivation layer 131 portion may be deposited upon the V3 level 140 passivation layer 131 portion, upon via(s) (e.g., via 34, via 39, and/or vias associated formed upon VSS wire 32), and upon lower skip via 36 and liner 176 associated therewith.

The M3 level 142 passivation layer 131 portion may be patterned to create one or more wire trench(es) therein and conductive or metal may be deposited within the wire trench(es) thereby forming VSS wire 38, VDD wire 40, VSS wire 42, and/or VDD wire 44. VDD wire 40 may connect with via 34. VSS wire 42 may connect with lower skip via 36. VDD wire 44 may connect with via 39. More specifically, VDD wire 40 may be formed directly upon via 34, VSS wire 42 may be formed directly upon lower skip via 36 and liner 176 associated there with, and VDD wire 44 may formed directly upon via 39. As such, VDD wire 40 and VDD wire 44 may be connected to VDD wire 30 by via 34 and by via 39, respectively.

The diameter or dimension of the lower skip via 34 at the top of the lower skip via 36 may be smaller than the width dimension of VSS wire 42, as depicted. VSS wire may be formed directly upon a via that connects VSS wire 38 with VSS wire 32 there below.

The backside level 130 may be further fabricated by depositing passivation layer 131 portion upon the M3 level 142 within V4 level 144. The V4 level 144 passivation layer 131 portion may be patterned to create one or more via opening(s) therein and conductive or metal may be deposited within the wiring trench(es) thereby forming via 46 and via 48. Vias 46, 48 may be formed upon VDD wire 40 or VDD wire 44, respectively. Other via(s) (not shown and in a different plane) may also similarly be formed upon VSS wire 38.

The backside level 130 may be further fabricated by forming M4 level 146. M4 level 146 may be formed by depositing a M4 level 146 passivation layer 131 portion upon the V4 level 144. For example, the M4 level 146 passivation layer 131 portion may be deposited upon the V4 level 144 passivation layer 131 portion, upon via(s) (e.g., via 46, via 48, and/or via(s) formed upon VSS wire 38).

The M4 level 146 passivation layer 131 portion may be patterned to create one or more wire trench(es) therein and conductive or metal may be deposited within the wire trench(es) thereby forming VSS wire 52 and/or VDD wire 50. VDD wire 50 may connect with via 46. VSS wire 52 may connect with the one or more via(s) formed upon VSS wire 38. More specifically, VDD wire 50 may be formed directly upon via 46, VSS wire 52 may be formed directly upon the one or more via(s) formed upon VSS wire 38. As such, VDD wire 50 may be connected to VDD wire 30 by via 26, VDD wire 40, and via 34 and/or by via 48, VDD wire 44, and/or via 39.

The backside level 130 may be further fabricated by depositing passivation layer 131 portion upon the M4 level 146 within a V5 level 148.

Figure 7:
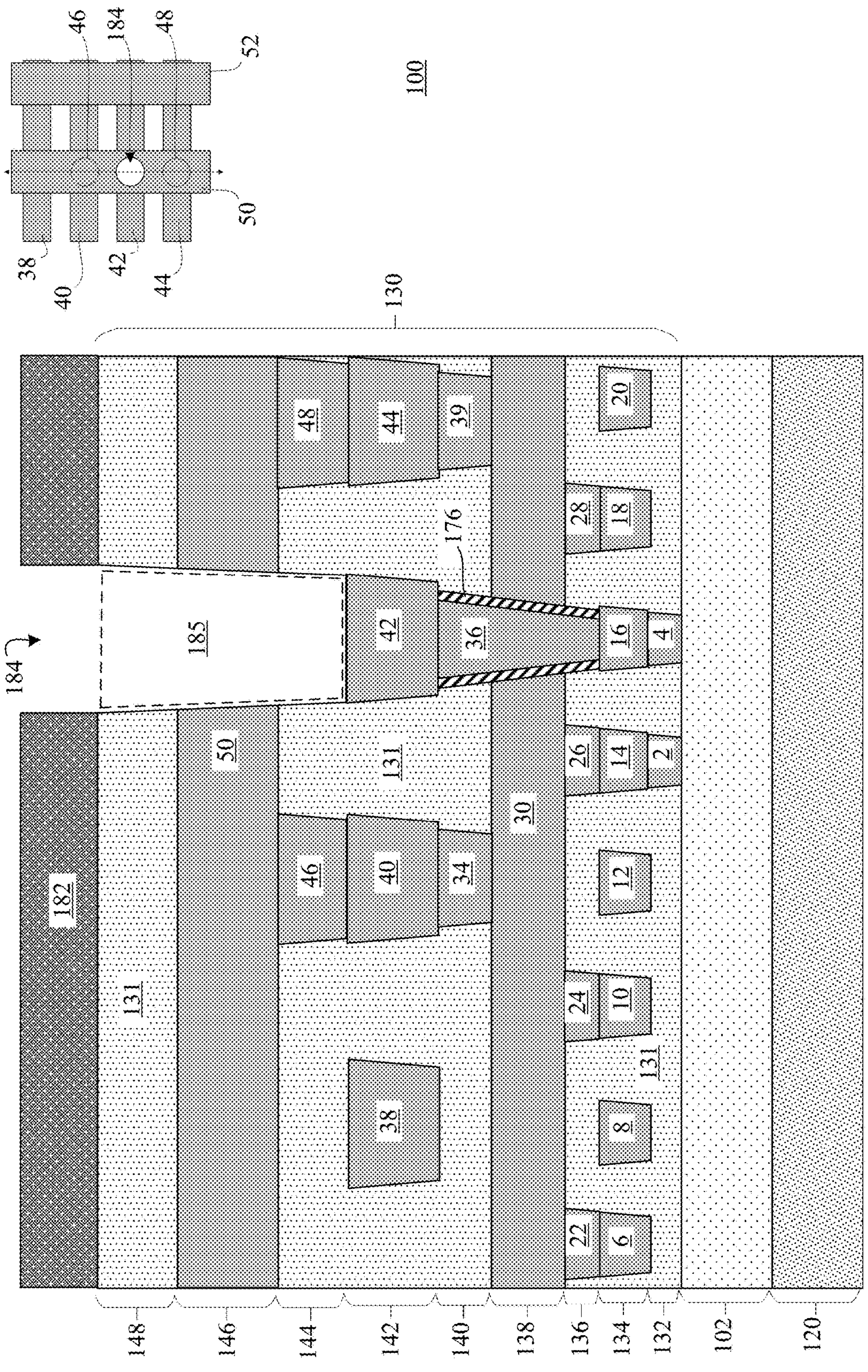

FIG. 7 depicts a top-down view and cross-section view of semiconductor IC device 100 that is to include super via 190 within backside level 130, according to one or more embodiments of the disclosure. At the present stage of fabrication, a mask 182 layer is formed upon the passivation layer 131 portion within the V5 level 148 and patterned and upper skip via opening 185 is formed.

Mask 182 may be formed upon the passivation layer 131 portion within the V5 level 148. For example, mask 182 may be formed as a blanket layer upon the top surface of the underlying passivation layer 131 portion of the V5 level 148. The mask 182 may be formed by deposition of mask material(s) or layer(s) of mask material(s). In a particular embodiment, mask 182 may be a hard mask. Exemplary mask materials may be silicon nitride (SiN), a combination of SiN and Silicon Dioxide (SiO2), an organic planarization layer (OPL), or the like.

The mask 182 may be patterned by removing undesired portions of mask 182 while retaining desired portions of mask 182. The retained portions of patterned mask 182 may effectively protect underlying regions of the passivation layer 131 portion within the V5 level 148 while the removed portions of mask 182 form opening 184 that may expose underlying regions of the passivation layer 131 portion within the V5 level 148 that correspond to a desired location of the super via 190 (e.g., vertically in line with VSS wire 42, etc.). The mask 182 may be patterned by lithography, etching, or other removal techniques.

Using the patterned mask 182, the passivation layer 131 portion within the V5 level 148 exposed by opening 184 may be removed, the VDD wire 50 within the M4 level 146 exposed by opening 184 may be removed, and the passivation layer 131 portion within the V4 level 144 exposed by opening 184 may be removed.

Such portions of semiconductor IC device 100 may be removed by an etching process, such as a dry or wet etch. The dry and wet etching processes can have etching parameters that can be tuned, such as etchants used, etching temperature, etching solution concentration, etching pressure, source power, RF bias voltage, RF bias power, etchant flow rate, and other suitable parameters to achieve the desired material removal. For example, a first etchant may be used to remove the exposed passivation layer 131 portion within the V4 level 144 stopping on VDD wire 50, a next etchant may be used to remove the exposed portion of VDD wire 50 stopping on the passivation layer 131 portion within the V4 level 144, then a next etchant may be used to remove the exposed passivation layer 131 portion within the V4 level 144 stopping on VSS wire 42. In another example, one etchant may be utilized and the semiconductor IC device 100 exposure to such etchant may be timed to remove the aforementioned exposed portions and stop material removal on VSS wire 42. Upon removal of the aforementioned exposed portions of the V5 level 140, the M4 level 146, and the V4 level 144, upper skip via opening 185 is formed.

Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

Figure 8:
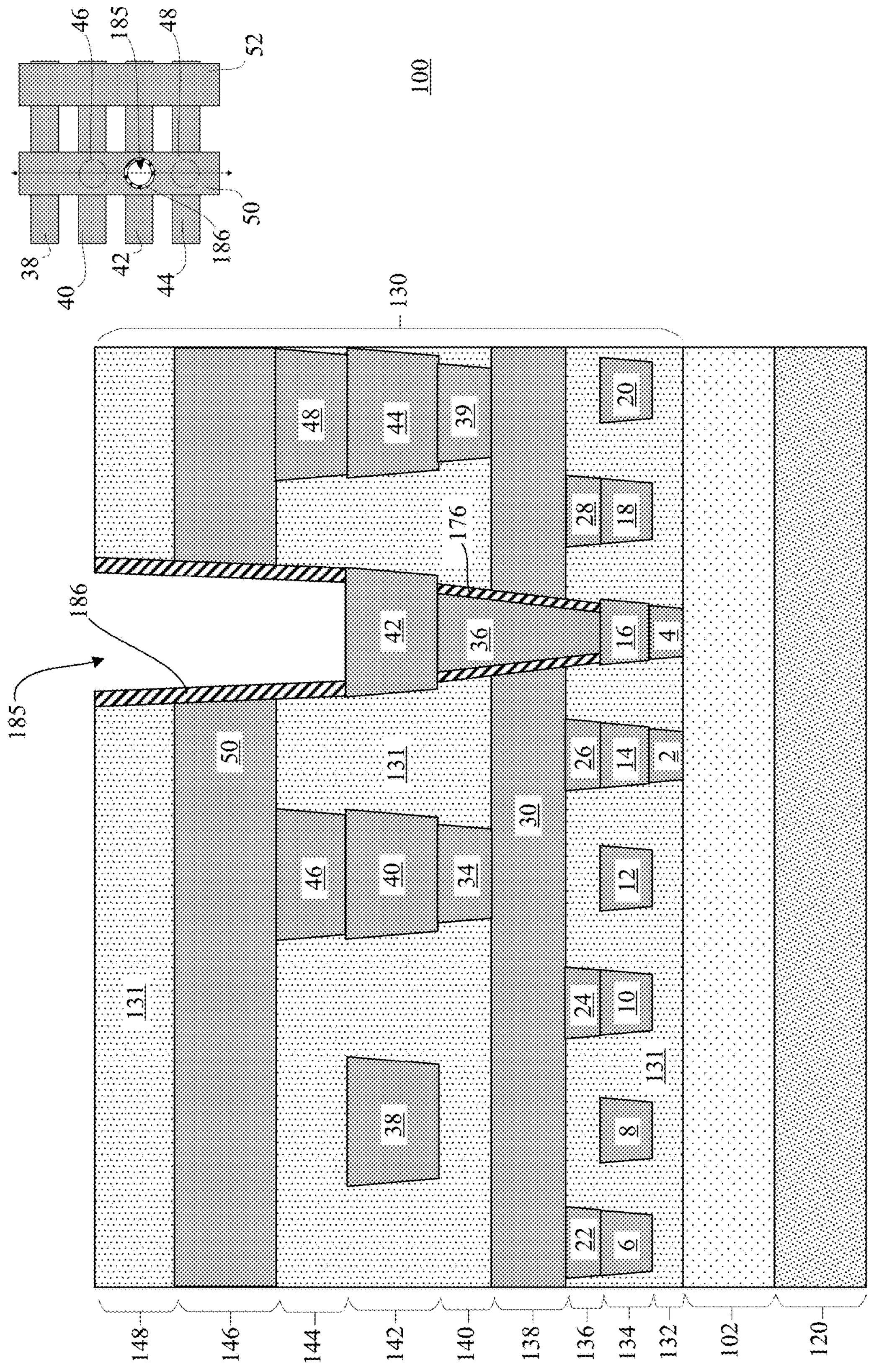

FIG. 8 depicts a top-down view and cross-section view of semiconductor IC device 100 that is to include super via 190 within backside level 130, according to one or more embodiments of the disclosure. At the present stage of fabrication, a liner 186 is formed within the upper skip via opening 185.

Liner 186 is formed upon the inner sidewall(s) of the upper skip via opening 185. Liner 186 may be formed by deposition techniques such PVD, CVD, ALD, or the like. The liner 186 can have a thickness of from about 2 nm to about 12 nm, although other thicknesses are within the contemplated scope. As VDD wire 50 may carry a relatively higher current compared to VDD wire 30, the liner 186 can be thicker relative to the liner 176 there below so as to adequately electrically isolate the super via 190 from VDD wire 50.

The liner 186 may be formed as a blanket layer. Horizontal portions of the liner 186 blanket layer may be removed along with mask 182 by a planarization process, such as a CMP, or the like. A retained portion the liner 186 blanket layer forms the liner 186 that generally lines the inner sidewall(s) of the upper skip via opening 185. Alternatively, the mask 182 may be removed (e.g., by an OPL ash, or the like) and the liner 186 may be subsequently formed upon the inner sidewall(s) the upper skip via opening 185.

As depicted, the liner 186 may be formed upon the upper surface of the VSS wire 42. The liner 186 may also be formed upon respective inner or internal sidewall surfaces of the passivation layer 131 portion within the V5 level 148, the VDD wire 50 within the M4 level 146, and the passivation layer 131 portion within the V4 level 144 that are associated with upper skip via opening 185. As depicted, the top surface(s) of liner 186 may be coplanar with the top surface of the passivation layer 131 portion within the V5 level 148.

Figure 9:
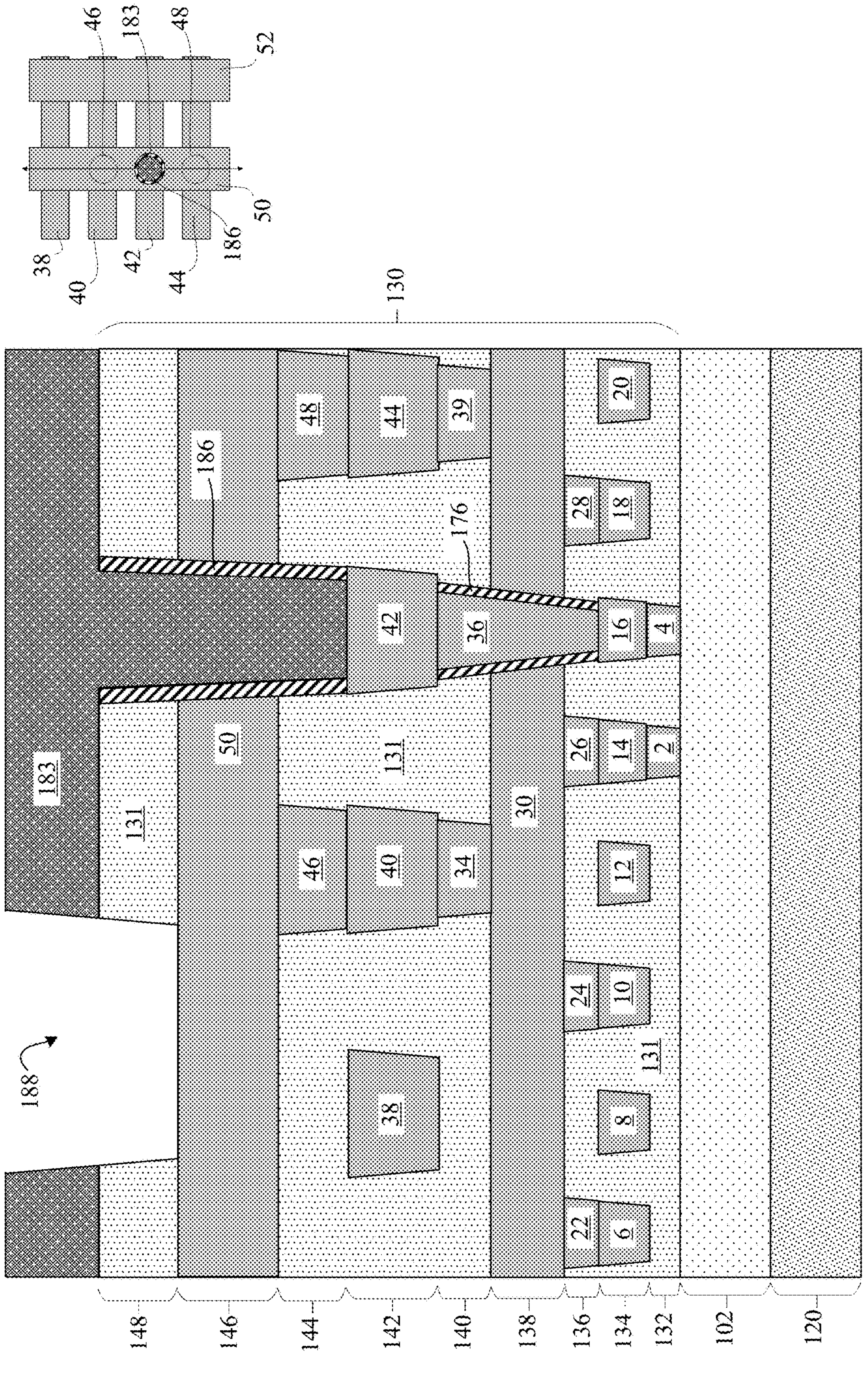

FIG. 9 depicts a top-down view and cross-section view of semiconductor IC device 100 that is to include super via 190 within backside level 130, according to one or more embodiments of the disclosure. At the present stage of fabrication, a mask 183 layer is formed upon the passivation layer 131 portion within the V5 level 148 and upon the liner 186 and is patterned.

Mask 183 may be formed upon the passivation layer 131 portion within the V5 level 148 and upon the liner 176 thereby filling the upper skip via opening 185. For example, mask 183 may be formed as a blanket layer upon the underlying passivation layer 131 portion within the V5 level 148. The mask 183 blanket layer may be formed to a thickness to fill the upper skip via opening 175. The mask 183 may be formed by deposition of mask material(s) or layer(s) of mask material(s). In a particular embodiment, mask 183 may be a hard mask. Exemplary mask 173 materials may be SiN, a combination of SiN and SiO2, OPL, or the like.

The mask 183 may be patterned by removing undesired portions of mask 183 while retaining desired portions of mask 183. The retained portions of patterned mask 183 may effectively protect underlying regions of the passivation layer 131 portion within the V5 level 148 and protect the upper skip via opening 185 while the removed portions of mask 183 form via opening 188 that may expose underlying regions of the VDD wire 50 within the M4 level 146. For clarity, in a different plane, the mask 183 may also be patterned to form via openings that respectively expose underlying regions of the VSS wire 52 within the M4 level 146. The mask 183 may be patterned by lithography, etching, or other removal techniques.

Using the patterned mask 183, the passivation layer 131 portion within the V5 level 148 exposed by the via openings may be removed by an etching process, such as a dry or wet etch. The dry and wet etching processes can have etching parameters that can be tuned to achieve the desired material removal. For example, a first etchant may be used to remove the exposed passivation layer 131 stopping on VDD wire 50, VSS wire 52, respectively. Upon removal of the exposed portions of the V4 level 148 the applicable via openings (e.g., via opening 188, etc.) are formed. Subsequently, the mask 183 may be removed by removal techniques such as etching, ashing, or the like. Specifically, the mask 183 material upon the liner 186 within upper skip via opening 185 is removed and effectively reforms the lower skip via opening 185. As depicted, etch parameters may be chosen to result in a tapered opening profile where a diameter or dimension of the upper skip via opening 185 is larger at the top of the upper skip via opening 185 than a diameter or dimension of the lower skip via opening 185 at the bottom of the lower skip via opening 185.

FIG. 10 depicts a top-down view and cross-section view of semiconductor IC device 100 that includes super via 190 within backside level 130, according to one or more embodiments of the disclosure. At the present stage of fabrication, via 54 is formed within via opening 188 and super via 190 is formed by the formation of upper skip via 56 within upper skip via opening 185.

The via 54 and upper skip via 56 may be formed by depositing a conductive material, such as a metal, upon the passivation layer 131 portion within the V5 level, within the respective via openings that are located over e.g., VDD wire 50, VSS wire 52, or the like, and upon liner 186 within upper skip via opening 185. The via 54 may be formed directly upon VDD wire 50. Other vias in a different plane may be formed directly upon VSS wire 52. The upper skip via 56 may be formed directly upon VSS wire 42. The liner 186, therefore, may adequately electrically isolate the VDD wire 50 from the VSS upper skip via 56.

The via 54 and upper skip via 56 can be comprised of metals, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, excess conductive material can be removed by chemical-mechanical polishing (CMP), etching, grinding, polishing. Resultingly, the top surface of the passivation layer 131 portion within the V5 level 148, the top surface of via 54, the top surface of the liner 186, and/or the top surface of upper skip via 56 may be coplanar.

The tapered profile of upper skip via opening 185 may enable or result in a diameter or dimension at the top of the upper skip via 56 being larger than a diameter or dimension at the bottom of the upper skip via 56. The diameter or dimension of the upper super 56 at the bottom of the upper skip via 56 may be smaller than (or inset from) the top width dimension of VSS wire 42, as depicted.

Figure 11:

FIG. 11 depicts a top-down view and cross-section view of semiconductor IC device 100 that includes super via 190 within backside level 130, according to one or more embodiments of the disclosure. At the present stage of fabrication, M5 level 150 is formed upon the V5 level 148 and upon super via 190.

The backside level 130 may be further fabricated by forming M5 level 160. M5 level 160 may be formed by depositing a M5 level 160 passivation layer 131 portion upon the V5 level 148. For example, the M5 level 150 passivation layer 131 portion may be deposited upon the V5 level 148 passivation layer 131 portion, upon via(s) (e.g., via 54, super via 190, and/or via(s) formed upon VSS wire 52).

The M5 level 150 passivation layer 131 portion may be patterned to create one or more wire trench(es) therein and conductive or metal may be deposited within the wire trench(es) thereby forming VSS wire 60 and/or VDD wire 58. VDD wire 58 may connect with via 54. VSS wire 60 may connect with the super via 190. More specifically, VDD wire 58 may be formed directly upon via 54. VSS wire 60 may be formed directly upon the upper skip via 56 and upon liner 186 therearound. As such, VDD wire 58 may be connected to VDD wire 50 by via 54. Similarly, VSS wire 60 may be connected to VSS wire 42 by upper skip via 56. As a result, VSS wire 60 may be connected to VSS wire 16 by super via 190 and VSS wire 42.

For clarity, semiconductor IC device 100 includes super via 190. Super via 190 includes a lower skip via 36 and an upper skip via 56. A wire, such as VSS wire 42, which may be referred to as the connecting wire, may be directly between the lower skip via 36 and the upper skip via 56. The upper skip via 56 may be adequately electrically isolated from a surrounding wire, such as VDD wire 50, by liner 186. The lower skip via 36 may be adequately electrically isolated from a surrounding wire, such as VDD wire 30, by liner 176. The super via 190 along with the connecting wire may connect a wire in the lowest BEOL M1 level 134 (i.e., VSS wire 16) with a wire in the highest BEOL M5 level 150 (i.e., VSS wire 60). Because of liner 176 and/or liner 186, super via 190 may be utilized for wiring and routing through the second BEOL level (e.g., power or signal routing) and be utilized as a concentrated heat transfer conduit through the backside of the semiconductor IC device 100.

For clarity, the super via 190 may include two or more super via structures (e.g., skip via 36 and upper skip via 56) with a respective liner therearound (e.g., liner 176, liner 186) within the second backside level 130 (e.g., within a BSPDN) that connects a V1 level 132 via (e.g., via 4) to a M5 level wire (VSS wire 60) to create an electrically and thermally connected path to one or more microdevice. The skip via 36 may connect a M1 level 134 wire (e.g., VSS wire 16) with a M3 level 142 wire (e.g., VSS wire 42) while being adequately electrically isolated from or skipping a M2 level 138 wire (e.g., VDD wire 30) by the liner 176. The skip via 56 may connect the M3 level 134 wire with a M5 level 150 wire (e.g., VSS wire 60) while being adequately electrically isolated from or skipping a M4 level 146 wire (e.g., VDD wire 50) by the liner 186. The super via 190 may electrically and convection connect with the microdevice(s) within the FEOL level 102. For clarity, the logic denoting VDD and VSS wires may be logically switched relative to the exemplary demarcation of such wires herein. For example, in an alternative embodiment, wires 16, 42, and 60 may be VDD wires as opposed to being VSS wires as demarked herein. In this embodiment, therefore, super via 190 is at VDD potential as opposed to VSS potential as demarked herein.

For clarity, as depicted, upper skip via 56 and lower skip via 36 may be located with respect to each other to share a vertical central axis or bisector, herein referred to as axis 191. In other words, upper skip via 56 and lower skip via 36 may be vertically aligned. Such vertical alignment may minimize a distance of an effective concentrated heat transfer path through the backside level 130. However, the independent nature of upper skip via 56 and lower skip via 36 may allow for the upper skip via 56 and lower skip via 36 to be vertically offset from each other. As such, upper skip via 56 and lower skip via 36 need not be vertically aligned and may have relatively different or offset axes 191.

The term adequately electrically isolated, or the like, is defined herein to be when there is no electrical interference, negligible electrical interference, or a lack of sufficient electrical interference between conductive features that would otherwise adversely affect the integrity of signal(s) transmitted by the conductive features and/or the integrity of potential(s) of the conductive features.

Figure 12:
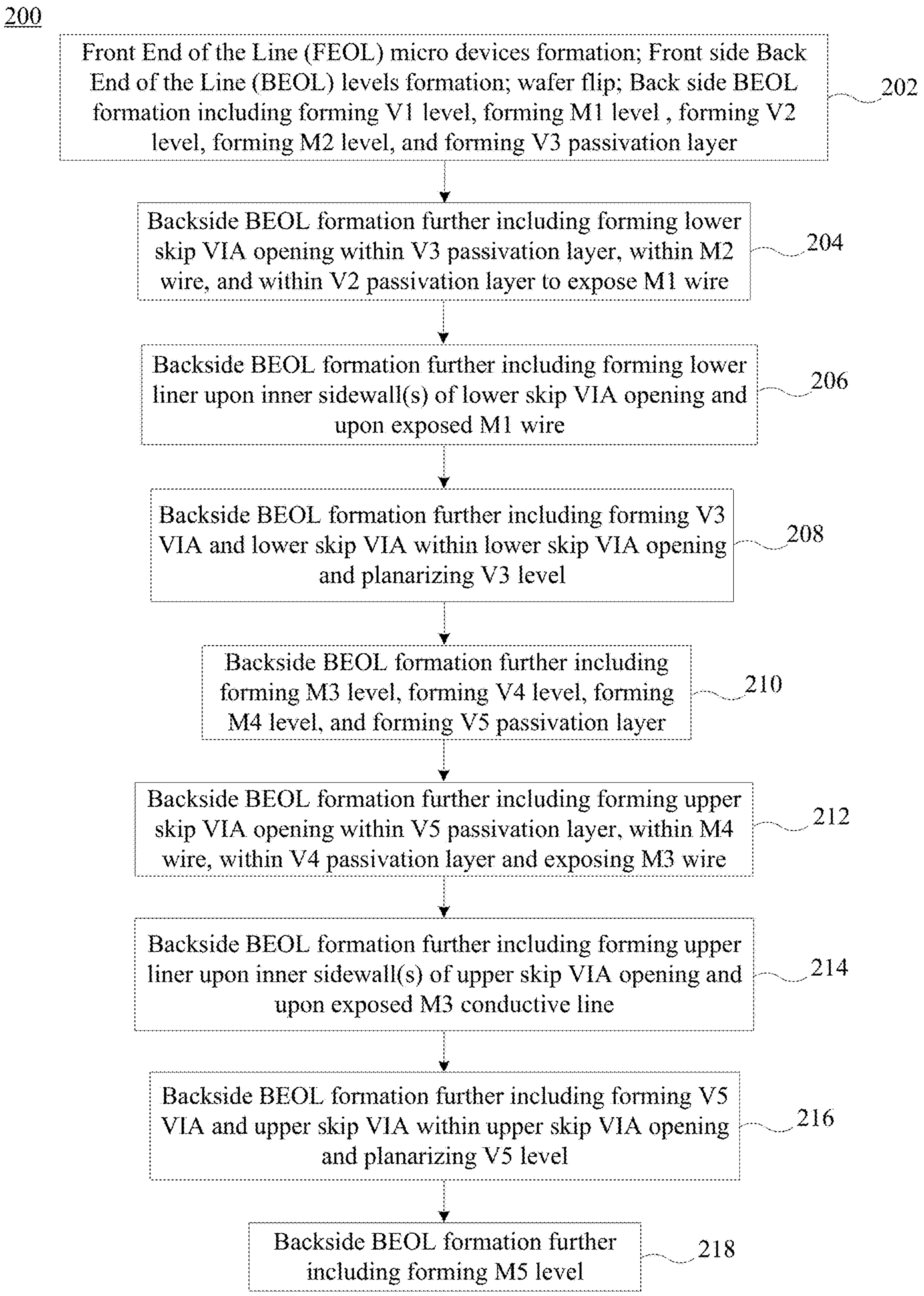
FIG. 12 depicts a method of fabricating a semiconductor IC device that includes a super via within a backside level, according to one or more embodiments of the disclosure.

FIG. 12 depicts a method 200 of fabricating semiconductor IC device 100 that includes super via 190 within backside level 130, according to one or more embodiments of the disclosure.

Method 200 begins, at block 202, with forming FEOL level 102 which includes one or more microdevices therein, with forming the first BEOL level 1120 upon the frontside interface of the FEOL level 102, with flipping the semiconductor IC device 100 (e.g., flipping the associated wafer), and with forming the second backside level 130. The second backside level 130 may be formed by forming V1 level 132, with forming M1 level 134, with forming V2 level 136, with forming M2 level 138, and with partially forming V3 level 140. Forming the V1 level 132 may include forming a V1 level 132 passivation layer 131 portion, forming via openings therein, and forming vias (e.g., vias 2, 4) therein. Forming the M1 level 134 may include forming a M1 level 134 passivation layer 131 portion, forming wire trenches therein, and forming wires (e.g., wires 6, 8, 10, 12, 14, 16, 18, and 20) therein. Forming the V2 level 136 may include forming a V2 level 136 passivation layer 131 portion, forming via openings therein, and forming vias (e.g., vias 22, 24, 26, and 28) therein. Forming the M2 level 138 may include forming a M2 level 138 passivation layer 131 portion, forming wire trenches therein, and forming wires (e.g., wires 30, 32) therein. Partially forming the V3 layer 140 may include forming a V3 level 140 passivation layer 131 portion.

Method 200 may continue, at block 204, with further forming the second backside level 130 by forming lower skip via opening 174 within the V3 level 140 passivation layer 131 portion, within a M2 level 138 wire, and within V2 level 136 passivation layer 131 portion to expose a M1 level 134 wire.

Method 200 may continue, at block 206, with further forming the second backside level 130 by forming lower liner 176 upon the inner sidewall(s) of the lower skip via opening 174 and upon portion(s) of the exposed M1 level 134 wire.

Method 200 may continue, at block 208, with further forming the second backside level 130 by forming via openings within the V3 level 140 passivation layer 131 portion, by forming vias (e.g., vias 34, 38) therein and forming lower skip via 36 within the lower skip via opening 174, and by planarizing the top surfaces of the vias within the V3 level 140 passivation layer 131 portion, the lower skip via 36, and the top surface of the V3 level 140 passivation layer 131 portion.

Method 200 may continue, at block 210, with further forming the second backside level 130 by forming M3 level 142, by forming V4 level 144, by forming M4 level 146, and by partially forming V5 level 148. Forming the M3 level 142 may include forming a M3 level 142 passivation layer 131 portion, forming wire trenches therein, and forming wires (e.g., wires 38, 40, 42, 44) therein. Forming the V4 level 144 may include forming a V4 level 144 passivation layer 131 portion, forming via openings therein, and forming vias (e.g., vias 46, 48) therein. Forming the M4 level 146 may include forming a M4 level 146 passivation layer 131 portion, forming wire trenches therein, and forming wires (e.g., wires 50, 52) therein. Partially forming the V5 layer 148 may include forming a V5 level 148 passivation layer 131 portion.

Method 200 may continue, at block 212, with further forming the second backside level 130 by forming upper skip via opening 185 within the V5 level 148 passivation layer 131 portion, within a M4 level 146 wire, and within V4 level 144 passivation layer 131 portion to expose a M3 level 142 wire (e.g., wire 42).

Method 200 may continue, at block 214, with further forming the second backside level 130 by forming liner 186 upon the inner sidewalls of upper skip via opening 185 and upon the exposed M3 level 142 wire.

Method 200 may continue, at block 216 with further forming the second backside level 130 by forming via openings within the V5 level 148 passivation layer 131 portion, by forming vias (e.g., via 54) therein and forming upper skip via 56 within the upper skip via opening 185, and by planarizing the top surfaces of the via(s) within the V5 level 148 passivation layer 131 portion, the upper skip via 56, and the top surface of the V5 level 148 passivation layer 131 portion.

Method 200 may continue, at block 218, with further forming the second backside level 130 by forming M5 level 150. Forming the M5 level 150 may include forming a M5 level 150 passivation layer 131 portion, forming wire trenches therein, and forming wires (e.g., wires 58, 60) therein. A M5 level 150 wire (e.g., wire 60) may be formed directly upon the upper skip via 56.

In some embodiments, method 200 may continue with forming interconnect level 152 upon the M5 level 150. For example, as shown in FIG. 13, a passivation layer 192 may be formed upon the M5 level 150, interconnect pad openings may be formed in passivation layer 192, interconnect pads (e.g., pads 196) may be formed within the interconnect pad openings, and an interconnect (e.g., interconnect 198) may be formed upon one interconnect pad.

Figure 13:
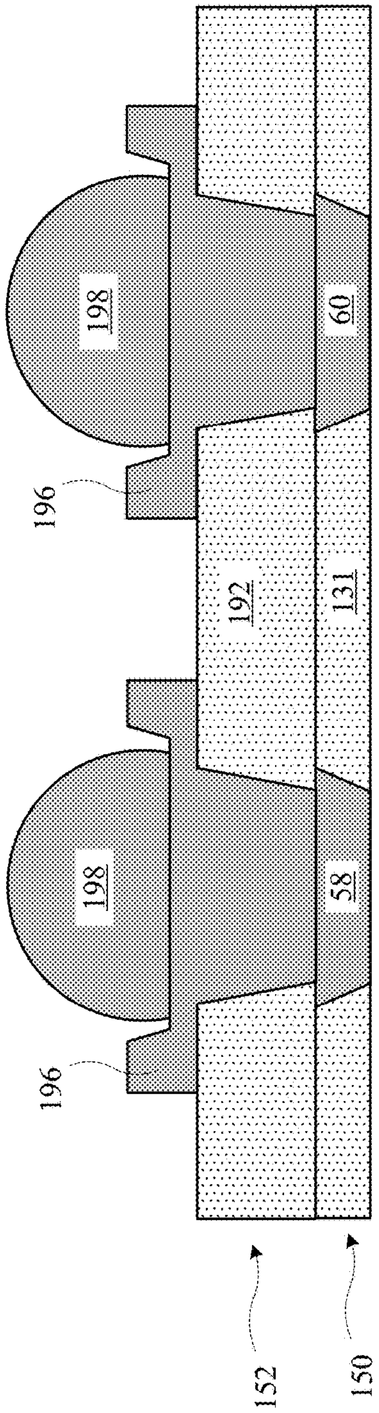
FIG. 13 depicts a cross-section view of an interconnect level, according to one or more embodiments of the disclosure.

FIG. 13 depicts a cross-section view of interconnect level 152, according to one or more embodiments of the disclosure. The passivation layer 192 may be formed upon the M5 level 150, interconnect pad openings may be formed in passivation layer 192, interconnect pads 196 may be formed within the interconnect pad openings, and interconnect 198 are formed over the interconnect pads 196. The passivation layer 192 may comprise polymers such as PBO, polyimide, BCB, or the like. Alternatively, passivation layer 192 may include non-organic dielectric materials such as silicon oxide, silicon nitride, silicon carbide, silicon oxynitride, or the like. The passivation layer 192 may be deposited by, for example, CVD, PVD, ALD, or the like.

An interconnect pad 196 is formed through the passivation layer 192 to wire (e.g., wire 58, 60, etc.) within M5 level 150, and interconnect 198 are formed interconnect pad 196. The interconnect pad 196 may comprise one or more layers of copper, nickel, gold, or the like, which are formed by a plating process, or the like. Interconnect 198 (e.g., solder balls, etc.) are formed on the interconnect pad 196. The formation of interconnect 198 may include placing solder balls on the exposed portions of interconnect pad 196 and then reflowing the solder balls. In alternative embodiments, the formation of interconnect 198 includes performing a plating step to form solder regions over the topmost wire 58, 60, etc. within M5 level 150 and then reflowing the solder regions. The interconnect pad 196 and the interconnect 198 may be used to provide input/output connections to other electrical components, such as, other device dies, redistribution structures, printed circuit boards (PCBs), motherboards, or the like. The interconnect pad 196 and the interconnect 198 may also be referred to as backside input/output pads that may provide signal, VDD, and/or VSS connections to the microdevice in the FEOL level 102.

The interconnect pad 196 and the interconnect 198 may be thermally and electrically connected to a microdevice within the FEOL level 102 by the super via 190 and associated conductive routing features (e.g., wires 60, 42, 16, etc., via 4, and the like). Thus, the super via 190 may help thermally concentrate and conduct heat away from the microdevice(s) and/or the wires 16, 42, 60 through the interconnect 198 the backside exterior of the semiconductor IC device 100. In some implementations, a via may separate and connect the wire (e.g., wire 58, 60) from the pad 196.

For clarity, etching processes may be chosen for the various conductive features that form the electrical and thermal connection from interconnect pad 196 to microdevice within FEOL level 102 to define a width of each conductive feature that is generally smaller than the conductive feature that is vertically there above, as depicted. This wide at top to narrow at bottom nature of such conductive features generally aid in relatively increasing volume of conductive material (e.g., metal) and efficiency of heat transfer through the interconnect 198 the backside exterior of the semiconductor IC device 100 where space exists at the higher backside level 130 levels (e.g., M3 level 142 through M5 level 150, etc.) while relatively decreasing volume of conductive material where space is constrained at the lower backside level 130 levels (e.g., M1 level 134 through M3 level 142, etc.).

For clarity, similar signal, VDD, VSS routing conductive features described with reference to the backside level 130 levels 132 through 150 may be formed in frontside level 120.

Figure 14:
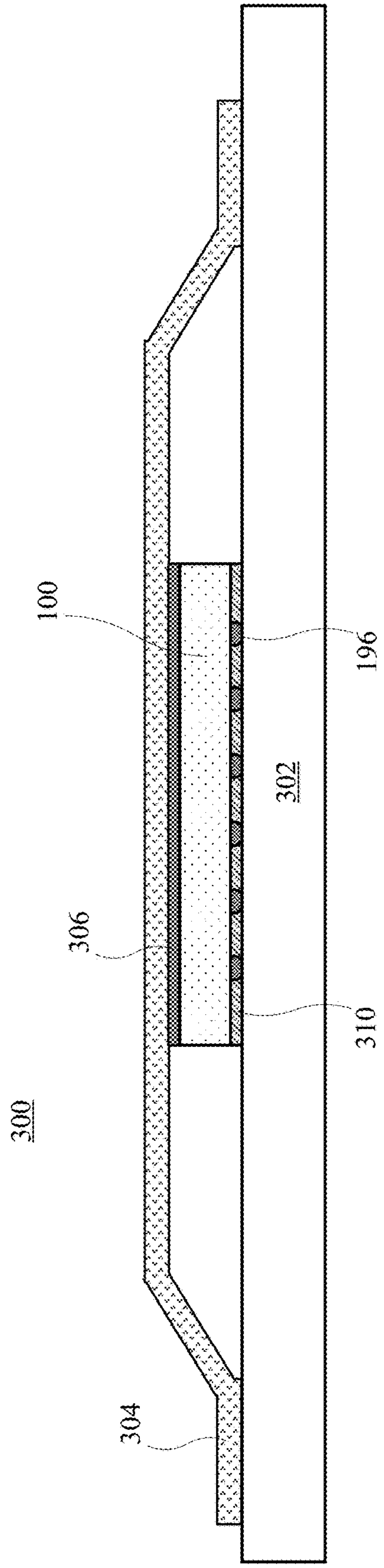
FIG. 14 depicts a cross-section view of an exemplary semiconductor IC device package that includes one or more semiconductor IC devices that utilize one or more embodiments of the disclosure.

FIG. 14 depicts a cross-section view of a packaged IC device 300 that includes the semiconductor IC device 100 that includes super via 190 within backside level 130. In the depicted example, packaged IC device 300 includes carrier 302, semiconductor IC device 100, interconnects 196, cover 304, thermal interface material 306, and underfill 310. The cover 304 is directly or indirectly (by way of thermal interface material 306) conduction connected to semiconductor IC device 100. As such, heat may be transferred through the front side interface of IC device 100 to cover 304. One or more super vias 190 may be present in semiconductor IC device 100 and associated with a particular interconnect 196. Therefore, the super via 190 may provide VSS, VDD potential to semiconductor IC device 100 through its associated interconnect 196 from carrier 302 which may receive the potential from a higher-level component, such as a system board. Similarly, the super via 190 may provide signal routing of a signal to semiconductor IC device 100 through its associated interconnect 196 from carrier 302 which may receive the signal the higher-level component. Further, the super via 190 may concentratedly transfer heat away from semiconductor IC device 100 through the backside interface through interconnect 196 and through carrier 302, and the like.

Semiconductor IC devices and methods for forming the same in accordance with the above-described techniques can be employed in various applications, hardware, and/or electronic systems. Suitable hardware and systems for implementing embodiments of the disclosure may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the disclosure. Given the teachings provided herein, one of ordinary skill in the art will be able to contemplate other implementations and applications of embodiments of the disclosure.

In some embodiments, the above-described techniques are used in connection with semiconductor IC devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

The various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. With respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor integrated circuit device, comprising:

a front-end-of-line (FEOL) level;

a frontside back-end-of-line (BEOL) level upon a frontside of the FEOL level; and a backside BEOL level upon a backside of the FEOL level, the backside BEOL level comprising a super via comprising a lower skip via, an upper skip via, a lower liner around sidewall(s) of the lower skip via, and an upper liner around sidewall(s) of the upper skip via, the backside BEOL level further comprising a M3 level wire between the lower skip via and the upper skip via, wherein a thickness of the upper liner from the sidewall(s) of the upper skip via is greater than a thickness of the lower liner from the sidewall(s) of the lower skip via.

2. The semiconductor integrated circuit device of claim 1, wherein the M3 level wire is further between the lower liner and the upper liner.

3. The semiconductor integrated circuit device of claim 1, wherein the super via provides VSS potential to the FEOL level.

4. The semiconductor integrated circuit device of claim 1, wherein the super via provides VDD potential to the FEOL level.

5. The semiconductor integrated circuit device of claim 1, wherein the upper liner separates the upper skip via from a M4 level wire.

6. The semiconductor integrated circuit device of claim 5, wherein the lower liner separates the lower skip via from a M2 level wire.

7. The semiconductor integrated circuit device of claim 6, wherein a bottom surface of a M5 level wire is connected to a top surface of the upper skip via and upon a top surface of the upper liner.

8. The semiconductor integrated circuit device of claim 6, wherein a top surface of a M1 level wire is connected to a bottom surface of the lower skip via and upon a bottom surface of the lower liner.

9. The semiconductor integrated circuit device of claim 1, further comprising:

an interconnect that is electrically connected to the super via and that is electrically connected to a carrier.

10. The semiconductor integrated circuit device of claim 9, wherein heat is concentratedly transferred from the backside BEOL level into the interconnect through the upper skip via and the lower skip via.

11. The semiconductor integrated circuit device of claim 1, wherein the upper skip via is vertically aligned with the lower skip via.

12. The semiconductor integrated circuit device of claim 1, wherein the upper skip via is vertically offset from the lower skip via.

13. A packaged semiconductor integrated circuit device comprising:

a carrier;

a cover connected to the carrier; and a semiconductor integrated circuit device electrically connected to the carrier by a plurality of interconnects and conduction connected to the cover, the semiconductor integrated circuit device comprising a front-end-of-line (FEOL) level; a frontside back-end-of-line (BEOL) level upon a frontside of the FEOL level; and a backside BEOL level upon a backside of the FEOL level, the backside BEOL level comprising a super via comprising a lower skip via, an upper skip via, a lower liner around sidewall(s) of the lower skip via, and an upper liner around sidewall(s) of the upper skip via, the backside BEOL level further comprising a M3 level wire between the lower skip via and the upper skip via, wherein a thickness of the upper liner from the sidewall(s) of the upper skip via is greater than a thickness of the lower liner from the sidewall(s) of the lower skip via.

14. The packaged semiconductor integrated circuit device of claim 13, wherein the M3 level wire is further between the lower liner and the upper liner.

15. The packaged semiconductor integrated circuit device of claim 13, wherein the super via receives VSS potential from one of the plurality of interconnects and provides VSS potential to the FEOL level.

16. The packaged semiconductor integrated circuit device of claim 13, wherein the super via receives VDD potential from one of the plurality of interconnects and provides VDD potential to the FEOL level.

17. The packaged semiconductor integrated circuit device of claim 13, wherein the upper liner separates the upper skip via from a M4 level wire.

18. The packaged semiconductor integrated circuit device of claim 17, wherein the lower liner separates the lower skip via from a M2 level wire.

19. A semiconductor integrated circuit device, comprising:

a front-end-of-line (FEOL) level comprising a transistor, a frontside surface, and a backside surface;

a frontside back-end-of-line (BEOL) level directly upon the frontside surface of the FEOL level and comprising an frontside interconnect electrically connected to a first source/drain of the transistor; and a backside BEOL level directly upon the backside surface of the FEOL level, the backside BEOL level comprising an a super via and a backside interconnect electrically connected to a second source/drain of the transistor, the super via comprising a lower skip via, an upper skip via, a lower liner around sidewall(s) of the lower skip via, and an upper liner around sidewall(s) of the upper skip via, the backside BEOL level further comprising a M3 level wire between the lower skip via and the upper skip via, wherein a thickness of the upper liner from the sidewall(s) of the upper skip via is greater than a thickness of the lower liner from the sidewall(s) of the lower skip via.

* * * * *